United States Patent [19]
Chuang

[11] Patent Number: 5,960,282
[45] Date of Patent: Sep. 28, 1999

[54] METHOD FOR FABRICATING A DYNAMIC RANDOM ACCESS MEMORY WITH A VERTICAL PASS TRANSISTOR

[75] Inventor: Shu-Ya Chuang, Hsinchu Hsien, Taiwan

[73] Assignee: United Semiconductor Corp., Hsinchu, Taiwan

[21] Appl. No.: 09/206,065

[22] Filed: Dec. 4, 1998

[51] Int. Cl.$^6$ ................................................. H01L 21/8242
[52] U.S. Cl. ........................... 438/255; 438/242; 438/253
[58] Field of Search ................................ 438/156, 173, 438/192, 206, 209, 212, 255, 239, 242, 244, 250, 253, 259, 268, 393, 394, 396, 399, 595

[56] References Cited

U.S. PATENT DOCUMENTS

| | | | |
|---|---|---|---|
| Re. 35,810 | 5/1998 | Prall | 438/259 |
| 5,106,776 | 4/1992 | Shen et al. | 438/242 |
| 5,398,200 | 3/1995 | Mazure et al. | 438/156 |
| 5,691,221 | 11/1997 | Jun | 438/253 |
| 5,700,727 | 12/1997 | Manning | 438/242 |
| 5,792,690 | 8/1998 | Sung | 438/253 |
| 5,795,804 | 8/1998 | Jenq | 438/244 |

Primary Examiner—Charles Bowers
Assistant Examiner—Jack Chen
Attorney, Agent, or Firm—Jiawei Huang; J. C. Patents

[57] ABSTRACT

A method for fabricating a DRAM cell with a vertical pass transistor is provided. The method of the invention includes sequentially forming a drain region, a gate structure, a source region, and a capacitor on a semiconductor substrate in a vertical distribution so that an area used by the drain region is the total area used by the DRAM cell on the substrate. In other world, the gate structure, the source region, and the capacitor are formed above the semiconductor substrate without direct contact.

20 Claims, 6 Drawing Sheets

METHOD FOR FABRICATING A DYNAMIC RANDOM ACCESS MEMORY WITH A VERTICAL PASS TRANSISTOR

CROSS-REFERENCE TO RELATED APPLICATION

This application claims the priority benefit of Taiwan application serial no. 87117945, filed Oct. 29, 1998, the full disclosure of which is incorporated herein by reference.

BACKGROUND OF THE INVENTION

1. Field of the Invention

This invention relates to semiconductor fabrication, and more particularly to a method for fabricating a dynamic random access memory (DRAM) with a vertical pass transistor.

2. Description of Related Art

A memory device with higher cell density naturally has a higher memory capacity, and accordingly has a lower fabrication cost. In order to increase the memory capacity in a DRAM device, a strategy to increase a memory cell density is generally taken. A higher device density is usually achieved by reducing structures dimension of an integrated circuit (IC), such as line width, line pitch distance, transistor gate, or coupled capacitor.

A DRAM cell typically includes a field-effect transistor (FET) and a capacitor coupled to the FET. A DRAM device usually includes a large number of DRAM cells arranged in an array structure. Each DRAM cell can store one binary data through a capacitor charge status. A charged capacitor stores a binary data of "1", and a discharged capacitor stores a binary data of "0". The action of charging or discharging is done by its coupled FET through a voltage status applied on its drain region. A desired FET can also be selected by a bit line and a word line. The world line is typically coupled to each gate of the FETs in the DRAM array, and the bit line is typically coupled to each drain of the FETs of the DRAM array. The bit line provides the voltage status to the FET. The world line is used to turn on/off the FET. Through a selected pair of the bit line and the world line, a desired FET is selected and is written-in a binary data to the coupled capacitor. The stored binary data can also be read out by selecting the FET and switching the bit line to a comparator circuit to obtain the charge status of the coupled capacitor. The stored binary data in the selected DRAM cell is therefore obtained.

The capacitor stores charges on its lower and upper electrode surfaces, which are separated by a dielectric layer. The lower electrode is coupled to the source of the FET. The amount of stored charges in one capacitor depends on its capacitance. The capacitance is proportional to its electrode surface, such as the lower electrode surface, inversely proportional to the distance between the upper electrode and the lower electrode, and proportional to the dielectric constant.

In order to reduce the device dimension, the surface of the lower electrode is usually also reduced. In this manner, its capacitance is reduced. If the capacitance of the capacitor is reduced, a lot of issues may be induced. For example, a decay mechanism and a charge leakage may cause an error content of the stored binary data due to small quantity of stored charges, which therefore has small tolerance of charge variance. Generally, in order to prevent the error content of the stored binary data, the capacitor is necessarily refreshed in a certain period of time, which is also called a refreshing cycle time. If the capacitance is smaller, the refreshing cycle time is shorter, and the refreshing process is necessarily more often performed. During each time of the refreshing process, the DRAM can not fulfills its function. This is called a dead time. A smaller capacitance has more dead time, and the efficiency of the DRAM performance is reduced. Moreover, a smaller capacitance needs a more sensitive amplifier, which cause a more complicated circuit and a more fabrication cost.

In order to maintain sufficient capacitance in the DRAM cell as the device dimension is reduced, several similar conventional capacitor structures have been proposed. A typical one is shown in FIGS. 1A–1C, which are cross-sectional views of a portion of a substrate, schematically illustrating a conventional fabrication process for forming a capacitor on a FET. In FIG. 1A, a gate 106, a gate oxide layer 104, and an interchangeable source/drain region 108 serving together as a metal-oxide semiconductor (MOS) transistor are formed on a semiconductor substrate 100. A shallow trench isolation (STI) structure 102 is also formed in the substrate 100 to isolate the MOS transistor. A dielectric layer 110 is formed over the substrate 100. A contact plug 112 is formed in the dielectric layer 110 to have an electrical coupling to the interchangeable source/drain region.

In FIG. 1B, a conductive layer 114 is formed over the substrate 100 so as to be electrically coupled to the interchangeable source/drain region 108 through the contact pug 112.

In FIG. 1B and FIG. 1C, the conductive layer 114 is patterned to remove a side portion of the conductive layer 114 so that a remaining portion of the conductive layer 114 becomes a conductive layer 114a, which covers the contact plug 112 and its surrounding region. The conductive layer 114a and the contact plug 112 serve as a lower electrode of a capacitor, which is electrically coupled to the interchangeable source/drain. A conformal hemispherical silicon grain (HSG) layer 115 is formed on the conductive layer 114a. Since the HSG layer 115 includes several hemispherical structures, the total surface area is increased, and the capacitance is consequently increased without consuming much of the available area of the substrate 100. A dielectric thin film 116 is formed on the HSG layer 115. An upper electrode 118 is formed on the dielectric thin film 116 so as to accomplish a fabrication of the capacitor coupled the to a MOS transistor. This MOS transistor with a capacitor serve as a cell in a DRAM device.

In the conventional method for fabricating a DRAM cell as described above, the formation is limited by a spatial resolution resulting from a light source used in photolithography, and an alignment precision in each process. All substructures, such as The gate width, line width, aperture of contact opening, a distance between the gate and the contact opening, and so on have their dimension limitation. Moreover, in the conventional DRAM cell structure, the bit line, the gate structure, and the capacitor are horizontally distributed. The available area of substrate for one DRAM cell is necessarily shared by the MOS transistor and the capacitor. This causes the DRAM cell dimension not to be largely reduced.

Furthermore, since the capacitor is directly coupled to the junction region, which is the interchangeable source/drain region, a junction leakage may further induce the charge leakage of the capacitor. This causes a shorter refreshing cycle time. The refreshing process is performed more frequently. The accumulated dead time of the DRAM device is increased. So, the DRAM performance is very inefficient.

SUMMARY OF THE INVENTION

It is therefore an objective of the present invention to provide a method for fabricating a DRAM cell with a vertical pass transistor, which has sufficient capacitance and less consumption on an available area of a substrate. The integration can be therefore greatly increased.

It is another an objective of the present invention to provide a method for fabricating a DRAM cell with a vertical pass transistor, which is not directly coupled to an interchangeable source/drain region. Hence, if junction leakage occurs, it does not further induce charge leakage of the capacitor. The refreshing cycle time is maintained to be sufficiently long.

In accordance with the foregoing and other objectives of the present invention, a method for fabricating a DRAM cell with a vertical pass transistor is provided. The method of the invention includes sequentially forming a drain region, a gate structure, a source region, and a capacitor on a semiconductor substrate in a vertical distribution so that an area used by the drain region is the total area used by the DRAM cell on the substrate. In other world, the gate structure, the source region, and the capacitor are formed above the semiconductor substrate without direct contact. Moreover, the DRAM cell is formed to have a columnar structure so that the integration is further increased.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

A DRAM cell usually includes a pass MOS transistor and a capacitor coupled to a source region. Conventional, the pass MOS transistor and the capacitor are formed in a horizontal distribution on a substrate. The invention provides a method to fabricate a DRAM cell, of which the pass MOS transistor and the capacitor are vertical distributed on a substrate.

Figure 1A:
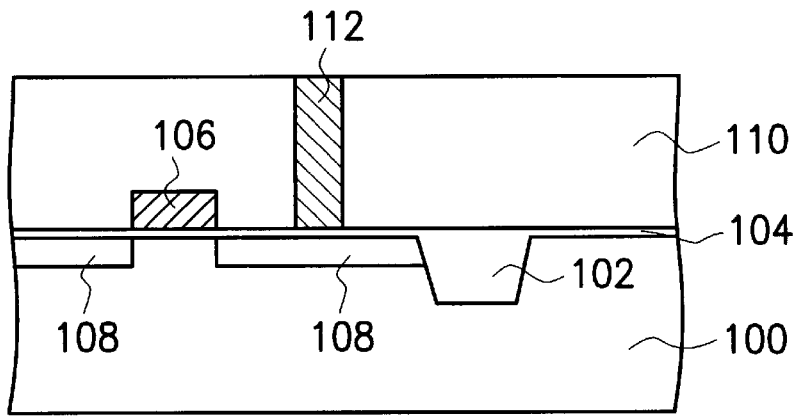
FIGS. 1A–1C are cross-sectional views of a portion of a substrate, schematically illustrating a conventional fabrication process for forming a capacitor on a FET, used in a DRAM cell.
Figure 1B:
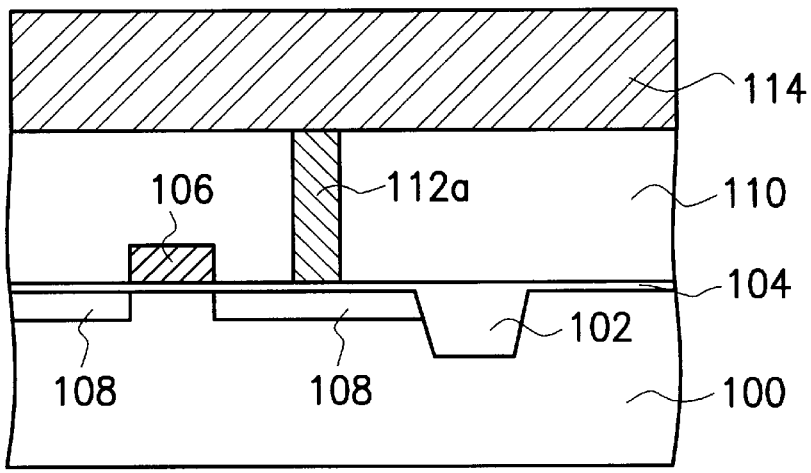
Figure 1C:
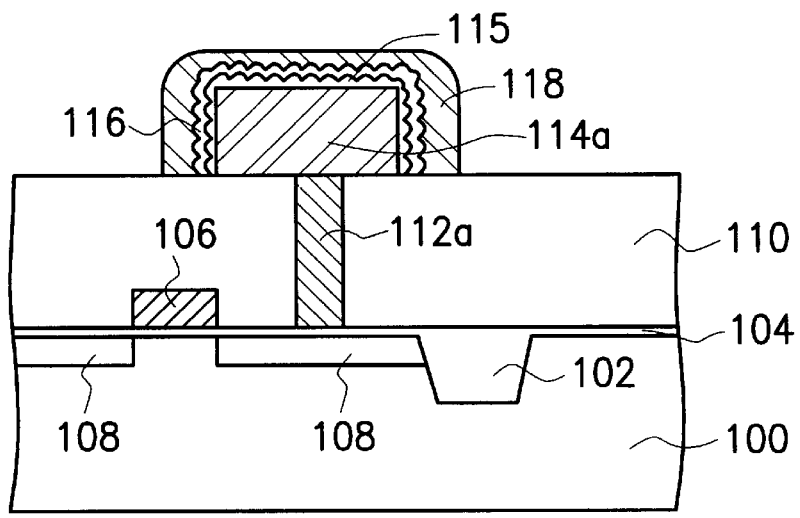
Figure 2A:
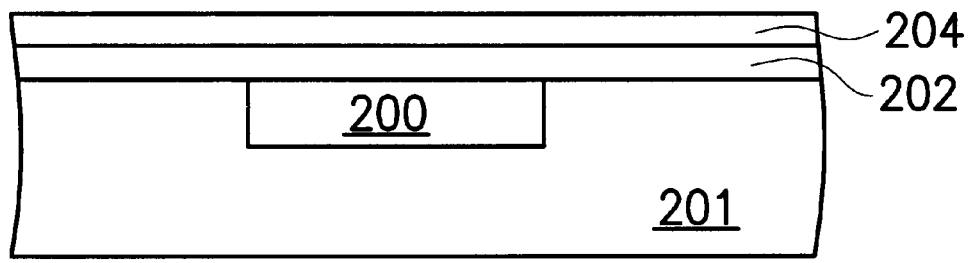
FIGS. 2A–2J are cross-sectional views of a portion of a substrate, schematically illustrating a fabrication process for forming a DRAM cell with a vertical pass transistor, according to a preferred embodiment of the invention.

FIGS. 2A–J are cross-sectional views of a portion of a substrate, schematically illustrating a fabrication process for forming a DRAM cell with a vertical pass transistor, according to a preferred embodiment of the invention. In FIG. 2A, a doped region 200 is formed in a semniconductor substrate 201. The doped region 200 includes an N$^+$-type dopant. The doped region 200 is to be used as a drain region of a pass MOS transistor later. The doped region 200 also serves as a bit line, which is couple to a bit line control circuit (not shown) at its far end. An insulating layer 202 is formed over the substrate 202 by, for example, chemical vapor deposition (CVD). A conductive layer 204, serving as a word line, is formed on the insulating layer 202 by, for example, CVD. The conductive layer 204 includes, for example, polysilicon or polycide, in which polysilicon is preferably doped also to increase its conductivity. The purpose of the insulating layer is for isolation between the doped region 200 and the conductive layer 204.

Figure 2B:
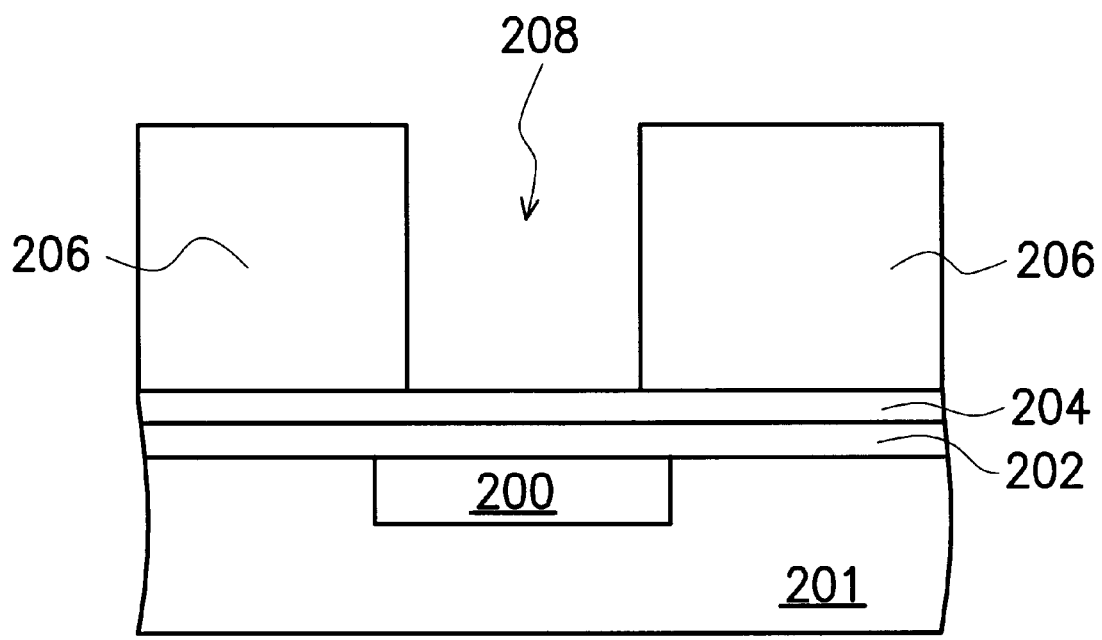

In FIG. 2B, a dielectric layer 206 is formed on the conductive layer 204 by, for example, CVD. The dielectric layer is patterned by, for example, photolithography and anisotropic etching to form a contact opening 208 that exposes a portion of the conductive layer 204 above the doped region 200.

Figure 2C:
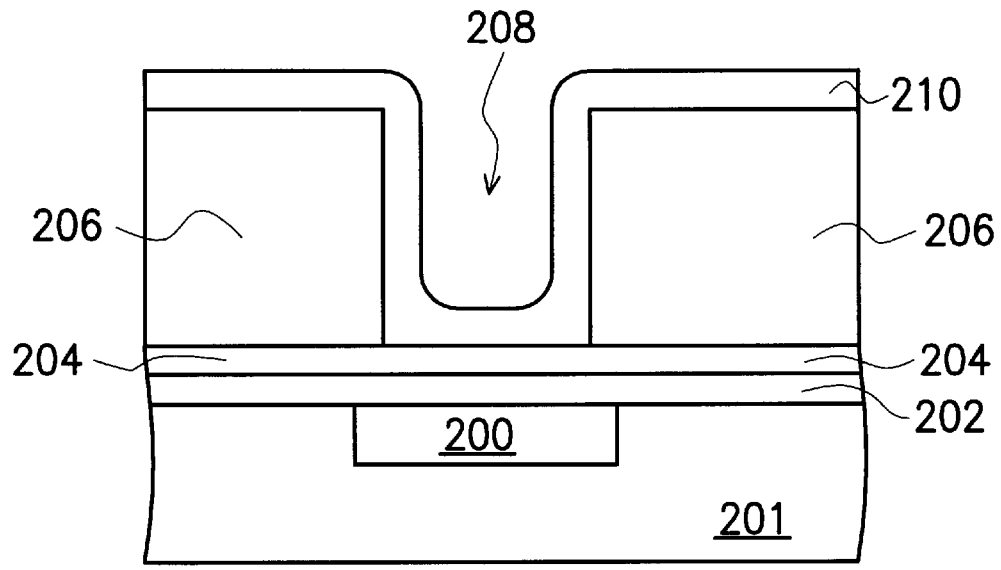

In FIG. 2C, a conductive layer 210 is formed over the substrate 201 by, for example, CVD. Since the conductive layer is conformal to a current top surface over the substrate contact 1, the contact opening 208 is not fully filled by the conductive layer 210. The conductive layer 210 includes, for example, doped polysilicon. In order to prevent a native oxide layer (not shown) from occurring on the exposed portion of the conductive layer 204 before the conductive layer 210 is formed, a pre-cleaning process with a HF acid solution is usually performed before starting to deposit the conductive layer 210.

Figure 2D:
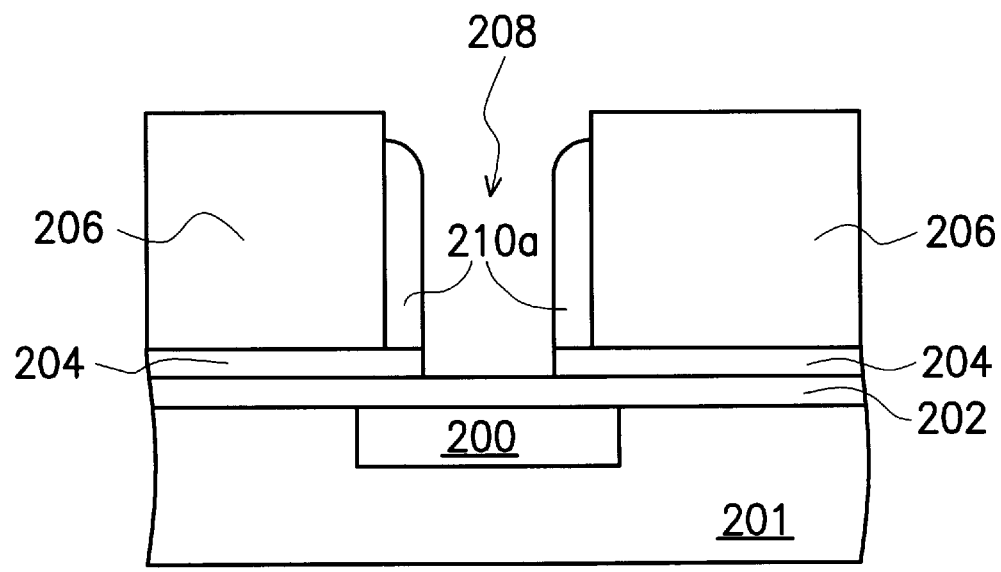

In FIG. 2C and FIG. 2D, an etching back process, such as an anisotropic etching process, is performed to remove the conductive layer 210 so that a remaining portion of the conductive layer 210 forms a conductive spacer 210a on each sidewall of the contact opening 208. In other words, the conductive spacer 210a is formed on each sidewall of the dielectric layer 206 within the contact opening 208. When the dielectric layer 206 is exposed, the conductive layer 204 is either already exposed or almost to be exposed. The etching back process is continuously performed to etch the conductive layer 204 within the contact opening 208 until a portion of the insulating layer 202 is exposed. The conductive spacer 210a is used as a gate of the vertical pass MOS transistor, which is to be gradually formed. A pre-cleaning process with HF acid solution is performed to clean away any residue resulting from the etching back process.

Figure 2E:
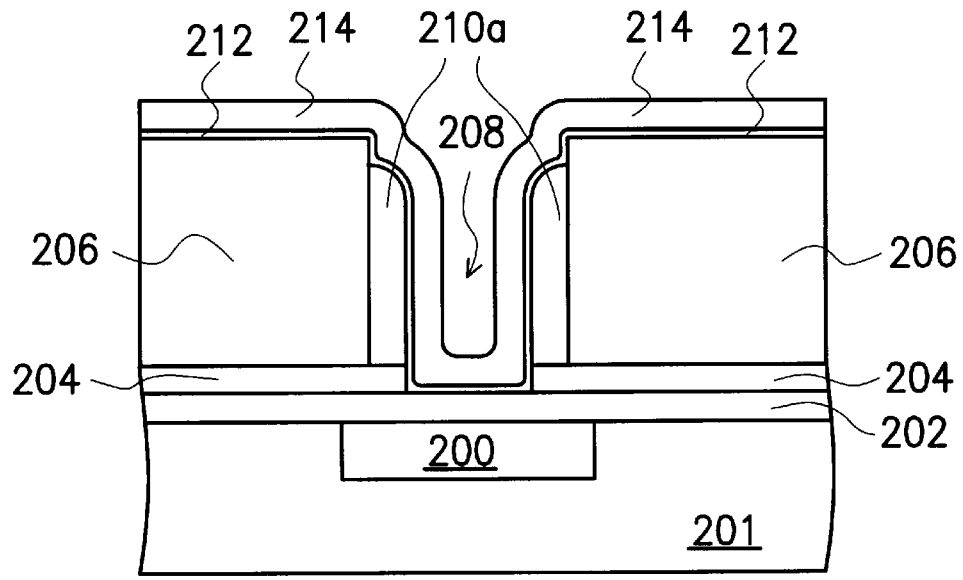

In FIG. 2E, a gate oxide layer 212, conformal to a top surface of the current structure, is formed over the substrate 201 by CVD. The gate oxide layer 212 includes, for example, high temperature oxide (HTO). A conformal channel layer 214 is formed on the gate oxide layer 212 by, for example, CVD. The channel layer 214 includes, for example, undoped polysilicon so as to protect the gate oxide layer 212, and serve as a channel region of the vertical pass MOS transistor. The contact open 208, at the current stage, is still not fully filled.

Figure 2F:
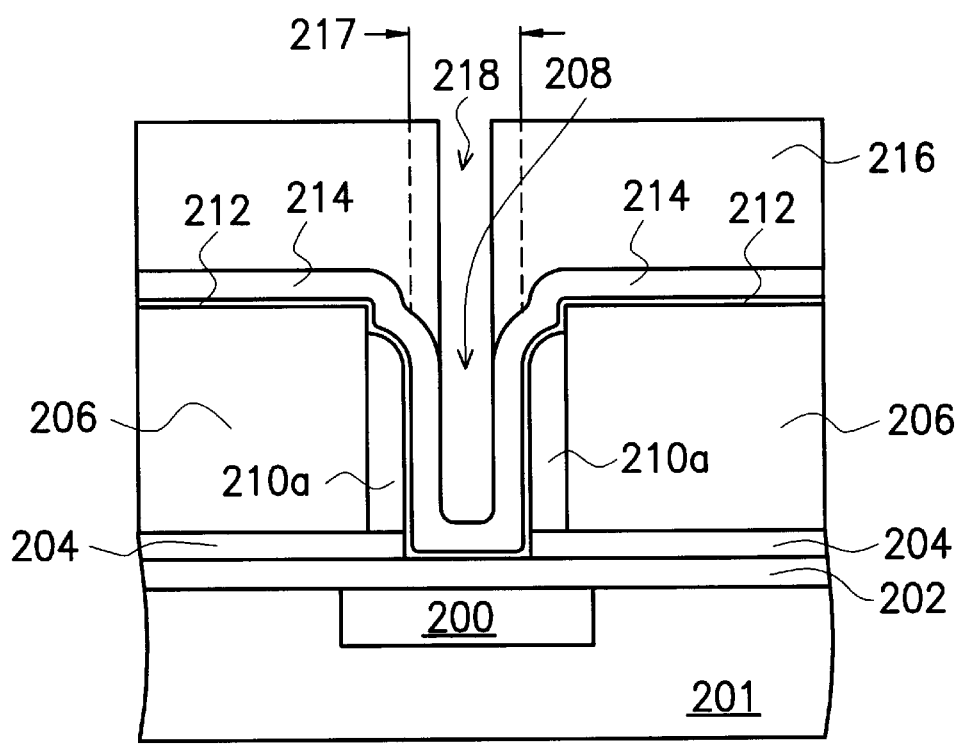

In FIG. 2E and FIG. 2F, a photoresist layer 216 is formed over the substrate 201 so that the contact opening 208 is filled by the photoresist layer 216. The photoresist layer 216 is patterned to form an opening 218, which has an aperture less than an aperture 208, which is relative to the gate oxide layer 212. This purpose is to prevent the channel layer 214 from being over-etched during a subsequent etching process, resulting in a damage to the gate oxide layer 212. The opening 218 preferably just exposes the channel layer 214 in the contact opening 208.

Figure 2G:
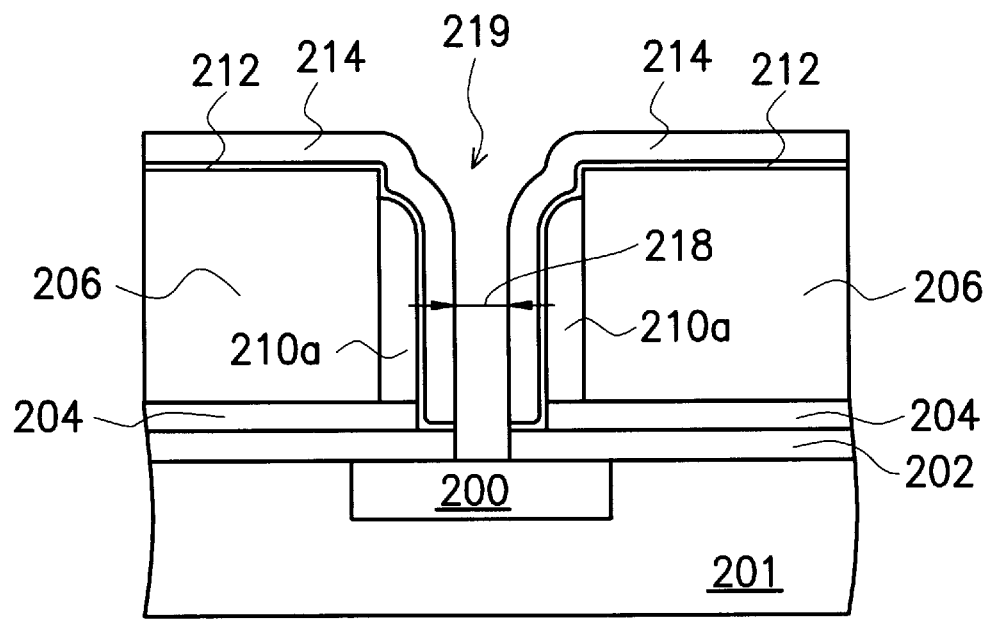

In FIG. 2F and FIG. 2G, using the photoresist layer 216 with the opening 218 as a mask, the channel layer 214, the gate oxide layer 212, and the insulating layer 202 are etched by, for example, anisotropic etching to form a drain contact opening 219 that exposes the doped region 200. The aperture of the drain contact opening 219 is determined by the opening 218 of the photoresist layer 216. The photoresist layer 216 is removed, and a pre-cleaning, process with HF acid solution is, for example, performed.

Figure 2H:
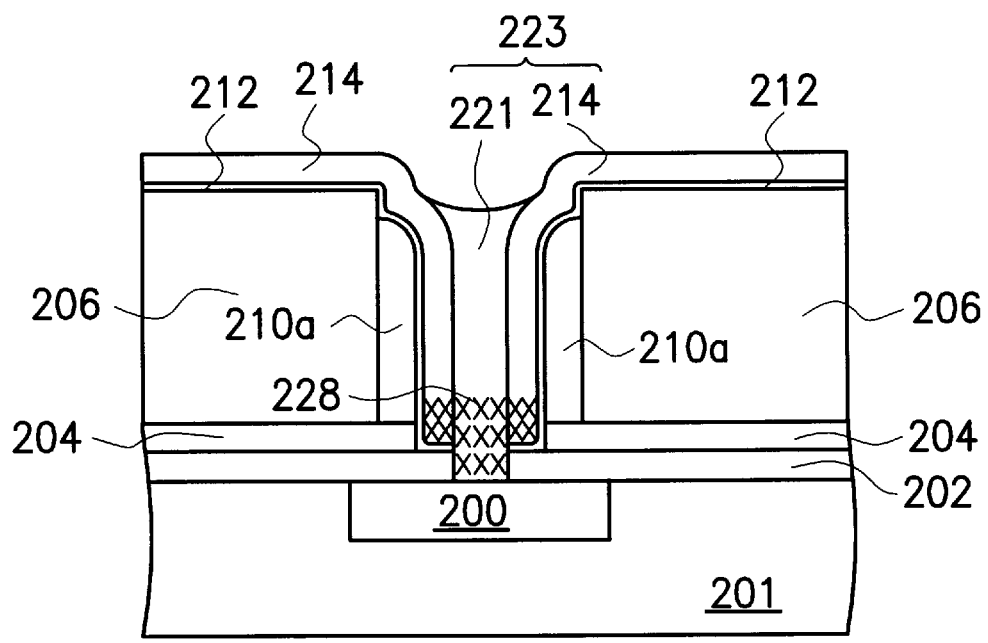

In FIG. 2G and FIG. 2H, a semiconductor plug 221 is formed to fill the opening 219. The formation of the semiconductor plug 221 includes, for example, depositing a semiconductor layer, such as a polysilicon layer, over the substrate 201, and performing an etching back process to remove the semiconductor layer so that a remaining portion of the semiconductor layer forms the semiconductor plug 221 to fill the opening 219. The semiconductor plug 221 has an electrical contact with the doped region 200, which serves as a drain region. The semiconductor plug 221 and the channel layer 214 serve together as a transistor main body 223 of the vertical pass MOS transistor. In addition, the transistor main body 223 and the conductive layer 204 serving as a word line are isolated by the gate oxide layer 212. The conductive layer 210a serving as the gate is electrically coupled to the conductive layer 204. A bottom portion 228 of the transistor main body 223 is preferably doped so as to reduce the contact resistance to the doped region 200. The dopant-type of the bottom portion 228 of the transistor main body 223 usually is the same as the dopant-type of the doped region 200. For example, if the doped region 200 is doped with $N^+$-type dopant, the bottom portion 228 of the transistor main body 223 is also doped with $N^+$-type dopant.

Figure 2I:
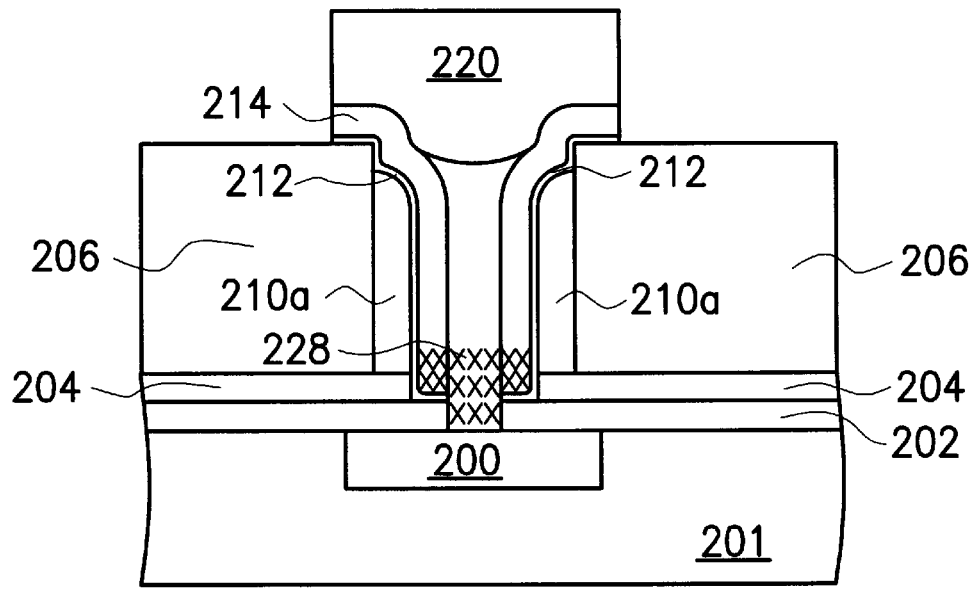

In FIG. 2H and FIG. 2I, a conductive layer 220 including, for example, doped polysilicon is formed over channel layer 214 and the semiconductor plug 221 by, for example, CVD. The conductive layer 220, the channel layer 214, and the gate oxide layer 212 are patterned by, for example, photolithography and etching to remove each side portion of these three layers 220, 214, and 212 so that the dielectric layer 206 is exposed at each side portion. A remaining portion of the conductive layer 220 serves as a source region of the vertical pass MOS transistor, and a lower electrode of a capacitor, which is to be formed. After patterning, each of the conductive layer 220, the channel layer 214, and the (ate oxide layer 212 has an exposed portion.

At the current stage, the vertical pass MOS transistor is formed to have a structure like a typical vertical thin film transistor (TFT). The vertical pass MOS transistor includes the dope region 200 serving as the drain region, the conductive layer 210a serving as a gate, the gate oxide layer 212, the channel layer 214, and the conductive layer 220 serving as the source region. The conductive layer 204 serves as the word line, and the doped region 200 serves as a bit line.

Figure 2J:
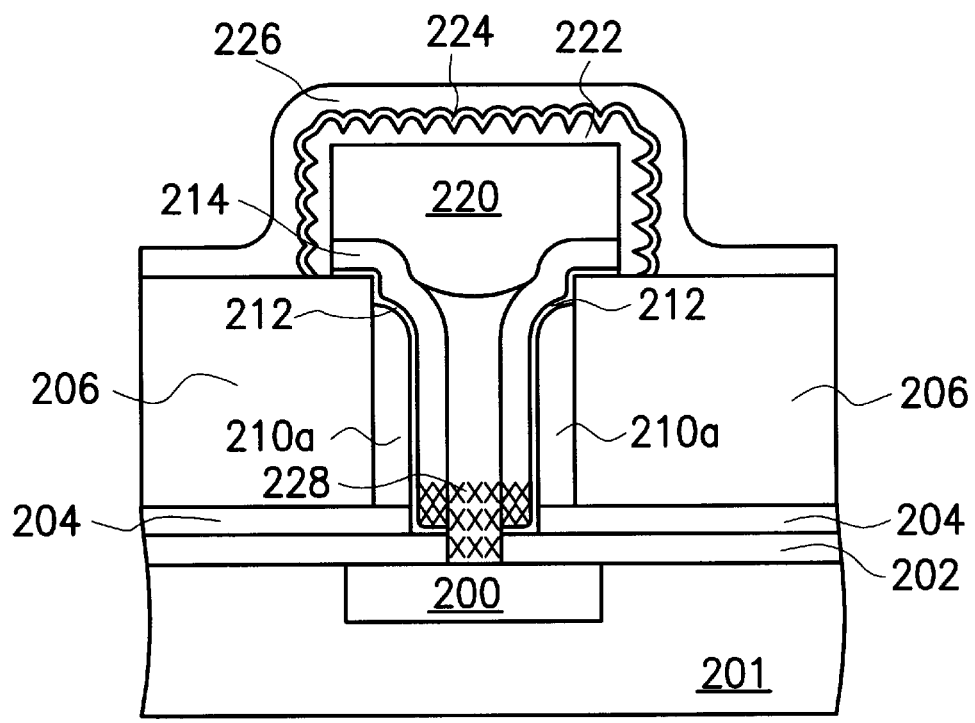

In FIG. 2J, a hemispherical silicon grain (HSG) layer 222 including silicon is formed on the exposed portions of the conductive layer 220, the channel layer 214, and the gate oxide layer 212. The formation of the HSG layer 222 includes, for example, a low pressure CVD (LPCVD) process with a reaction gas of SiH4 or $Si_2H_6$ at a proper conditions. Since the HSG layer 222 includes several hemispherical silicon grains, its surface used to store charges is increased, resulting in an increase of capacitance. The HSG layer 222 is preferably doped so as to increase its conductivity. A dielectric film layer 224 is formed on the HSG layer 222 by, for example, CVD. The dielectric film layer 224 includes for example, silicon-oxide/silicon-nitride/silicon-oxide (ONO) or other dielectric materials. A conductive layer 226 including doped polysilicon is formed over the substrate 201 to cover the dielectric film layer 224 and the dielectric layer 206 on the exposed portion. The formation of the conductive layer 226 includes, for example, a CVD process. The conductive layer 226 serves as an upper electrode of the capacitor mention above. The capacitor includes the conductive 220 and the HSG layer 222 both serving as the lower electrode, the dielectric film layer 224, and the conductive layer 226 serving as the upper electrode.

Since the conductive layer 220 also serves the source region of the vertical pass MOS transistor, the capacitor is automatically coupled to the drain region. A DRAM cell with word line and bit line is formed now. The structure of the DRAM is columnar including, for example, a cylindrical structure.

In conclusion, the method of the invention has several characteristics as follows:

1. The vertical pass MOS transistor and the capacitor of the DRAM are vertically distributed so that a single available substrate area is simultaneously used by the pass transistor and the capacitor. The horizontal dimension of the DRAM cell is greatly reduced. For the conventional DRAM cell, the pass transistor and the capacitor are horizontally distributed. So, the horizontal dimension of the conventional DRAM cell can not be greatly reduced.
2. The method of the invention is simpler than the convention method. The times of patterning is reduced.
3. In the vertical pass MOS transistor, the source region 220 is not formed in the substrate 201 so that the capacitor does not directly contact on the substrate. This manner can avoid charge leakage of the capacitor. The refreshing process is not necessary to be frequently performed. The dead time of the DRAM is therefore effectively reduced.
4. In the invention, the bit line 200, the word line 204, and the capacitor are vertically formed on the contact opening 208. The contact opening 208 can be easily formed with loose conditions of alignment and etching. Moreover, the bottom portion 228 of the transistor main body 223 is doped to reduce the contact resistance to the doped region 200.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a DRAM cell with a vertical pass transistor on a semiconductor substrate, the method comprising:

forming a doped region in the substrate wherein the doped region also serves as a bit line;

forming an insulating layer on the substrate;

forming a first conductive layer on the insulating layer, wherein the first conductive layer serves as a word line;

forming a dielectric layer on the first conductive layer;

patterning the dielectric layer to form a first contact opening about above the doped region to expose the first conductive layer;

forming a second conductive layer over the substrate;

etching the second conductive layer and the first conductive layer to form a conductive spacer on each inner sidewall of the first contact opening, and expose a portion of the insulating layer, wherein the conductive spacer serves as a gate of the vertical pass transistor;

forming a gate oxide layer over the substrate, wherein the gate oxide layer is conformal to a top surface over the substrate;

forming a channel layer on the gate oxide layer;

patterning the channel layer, the gate oxide layer, and the insulating layer to form a second contact opening to expose the doped region of the substrate, wherein the second contact opening comprises a sufficiently smaller aperture than that of the first contact opening so that a portion of the gate oxide layer on each sidewall of the first contact opening is not exposed;

forming a semiconductor plug to fill the second contact opening;

forming a third conductor layer on the semiconductor plug and the channel layer;

patterning the third conductive layer, the channel layer, and the gate oxide layer to expose the dielectric layer at a portion about other than the first contact opening so that these three patterned layers leave an exposed electrode surface, wherein a remaining portion of the third conductive layer serves as a source region of the vertical pass transistor, and a lower electrode of a capacitor;

forming a dielectric film layer on the exposed electrode surface; and forming a fourth conductive layer over the substrate to serve as an upper electrode of the capacitor.

2. The method of claim 1, wherein the step of forming the gate oxide layer comprises chemical vapor deposition (CVD).

3. The method of claim 1, wherein the gate oxide layer comprises high temperature oxide (HTO).

4. The method of claim 1, wherein the steps of forming the first, the second, the third, and the fourth conductive layers comprise CVD.

5. The method of claim 1, wherein the first, the second, the third, and the fourth conductive layers comprise doped polysilicon.

6. The method of claim 1, wherein the step of patterning the dielectric layer to form the first contact opening comprises anisotropic etching.

7. The method of claim 1, wherein the step of patterning the channel layer, the gate oxide layer, and the insulating layer to form the second contact opening comprises anisotropic etching.

8. The method of claim 1, wherein the step of forming the semiconductor plug further comprises:

depositing a semiconductor layer over the substrate to fill the second contact opening; and performing an etching back process to remove a portion of the semiconductor layer other than the second contact opening so that a remaining portion of the semiconductor layer forms the semiconductor plug to fill the second contact opening.

9. The method of claim 8, wherein the semiconductor layer comprises polysilicon.

10. The method of claim 8, wherein the step of depositing the semiconductor layer comprises CVD.

11. The method of claim 1, wherein after the step of forming the semiconductor plug, the method further comprises doping the semiconductor plug and the channel layer at a portion abutting the doped region in the substrate.

12. The method of claim 1, wherein the channel layer comprises undoped polysilicon.

13. The method of claim 1, wherein before the step of forming the dielectric film layer on the exposed electrode surface, the method further comprises forming a hemispherical silicon grain (HSG) layer over the exposed electrode surface to serve together with the third conductive layer.

14. The method of claim 13, wherein the HSG layer comprises silicon.

15. The method of claim 13, wherein the step of forming the HSG layer comprises low pressure CVD (LPCVD).

16. The method of claim 15, wherein the step of forming the HSG layer comprises a reaction gas of $SiH_4$ or $Si_2H_6$.

17. The method of claim 13 wherein the step of forming the HSG layer further comprises doping the HSG layer to increase its conductivity.

18. The method of claim 1 wherein the step of forming the doped region in the substrate comprises implanting $N^+$-type dopants.

19. The method of claim 1, wherein the step of forming the dielectric film layer comprises forming a silicon-oxide/silicon-nitride/silicon-oxide (ONO) dielectric layer.

20. The method of claim 1, wherein the step of forming the dielectric film layer comprises CVD.

* * * * *